(12) United States Patent
Kang et al.

(10) Patent No.: US 11,037,880 B2
(45) Date of Patent: Jun. 15, 2021

(54) SEMICONDUCTOR PACKAGE AND ANTENNA MODULE INCLUDING THE SAME

(71) Applicant: SAMSUNG ELECTRO-MECHANICS CO., LTD., Suwon-si (KR)

(72) Inventors: Myung Sam Kang, Suwon-si (KR); Yong Koon Lee, Suwon-si (KR); Young Gwan Ko, Suwon-si (KR); Young Chan Ko, Suwon-si (KR); Moon Il Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/556,816

(22) Filed: Aug. 30, 2019

(65) Prior Publication Data
US 2020/0373244 A1    Nov. 26, 2020

(30) Foreign Application Priority Data
May 21, 2019    (KR) .................. 10-2019-0059540

(51) Int. Cl.
*H01L 23/538*    (2006.01)
*H01L 23/367*    (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ......... H01L 23/5389; H01L 2223/6677; H01L 2224/214; H01Q 1/38
See application file for complete search history.

(56) References Cited

U.S. PATENT DOCUMENTS

| | | | | |
|---|---|---|---|---|
| 5,111,278 A | * | 5/1992 | Eichelberger | ......... H01L 23/473 |
| | | | | 257/698 |
| 7,656,015 B2 | * | 2/2010 | Wong | ...................... H01L 24/82 |
| | | | | 257/685 |

(Continued)

FOREIGN PATENT DOCUMENTS

KR    10-2017-0106479 A    9/2017
KR    10-2017-0136934 A    12/2017

*Primary Examiner* — Dale E Page
*Assistant Examiner* — Wilner Jean Baptiste
(74) *Attorney, Agent, or Firm* — Morgan, Lewis & Bockius LLP

(57) ABSTRACT

A semiconductor package includes a frame having first and second through-portions, first and second semiconductor chips, respectively in the first and second through-portions, each having a first surface, on which a connection pad is disposed, a first encapsulant covering at least a portion of the first and second semiconductor chips, a first connection member on the first and second semiconductor chips including a first redistribution layer electrically connected to the connection pads of the first and second semiconductor chips and a heat dissipation pattern layer, at least one passive component above the first semiconductor chip on the first connection member, and at least one heat dissipation structure above the second semiconductor chip on the first connection member and connected to the heat dissipation pattern layer.

20 Claims, 16 Drawing Sheets

(51) Int. Cl.
*H01Q 1/38* (2006.01)
*H01L 23/31* (2006.01)
*H01L 23/00* (2006.01)
*H01L 21/48* (2006.01)
*H01L 21/56* (2006.01)
*H01L 23/66* (2006.01)

(52) U.S. Cl.
CPC .......... *H01L 21/565* (2013.01); *H01L 21/568* (2013.01); *H01L 23/3128* (2013.01); *H01L 23/367* (2013.01); *H01L 23/5383* (2013.01); *H01L 23/5386* (2013.01); *H01L 23/66* (2013.01); *H01L 24/19* (2013.01); *H01L 24/20* (2013.01); *H01Q 1/38* (2013.01); *H01L 2223/6677* (2013.01); *H01L 2224/214* (2013.01); *H01L 2924/19106* (2013.01)

(56) References Cited

U.S. PATENT DOCUMENTS

| | | | |
|---|---|---|---|
| 9,978,731 B1 * | 5/2018 | Kim | ........................ H01L 23/66 |
| 2016/0260684 A1 | 9/2016 | Zhai et al. | |
| 2017/0352612 A1 | 12/2017 | Sung et al. | |

* cited by examiner

SEMICONDUCTOR PACKAGE AND ANTENNA MODULE INCLUDING THE SAME

CROSS-REFERENCE TO RELATED APPLICATION(S)

This application claims benefit of priority to Korean Patent Application No. 10-2019-0059540 filed on May 21, 2019 in the Korean Intellectual Property Office, the disclosure of which is incorporated herein by reference in its entirety.

TECHNICAL FIELD

The present disclosure relates to a semiconductor package and an antenna module including the same.

BACKGROUND

Semiconductor package designers are continuously pursuing lightness, thinness, shortness, and compactness in terms of design and pursing a System in Package (SiP) package requiring complexity and multifunctionality in terms of functionality. In this regard, there is growing interest in technology to mount a plurality of chips and components in a single package.

Specifically, in a semiconductor package including a plurality of semiconductor chips and passive components, signal loss is increased between a semiconductor chip and a passive component and between a semiconductor chip and an external device in which a semiconductor package is mounted, and heat dissipation is not effectively performed.

SUMMARY

An aspect of the present disclosure is to provide a semiconductor package, which significantly reduces signal transmission loss and has improved heat dissipation characteristics, and an antenna module including the semiconductor package.

According to an aspect of the present disclosure, in a semiconductor package and an antenna module including the same, a passive component and a heat dissipation member are mounted on a semiconductor chip.

A semiconductor package according to an example embodiment includes a frame having first and second through-portions, first and second semiconductor chips, respectively disposed in the first and second through-portions, each having a first surface, on which a connection pad is disposed, and a second surface opposing the first surface, a first encapsulant covering at least a portion of the first and second semiconductor chips, a first connection member, disposed on the first and second semiconductor chips, including a first redistribution layer electrically connected to the connection pads of the first and second semiconductor chips and a heat dissipation pattern layer, at least one passive component disposed above the first semiconductor chip on the first connection member and electrically connected to the first redistribution layer, and at least one heat dissipation structure disposed above the second semiconductor chip on the first connection member and connected to the heat dissipation pattern layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
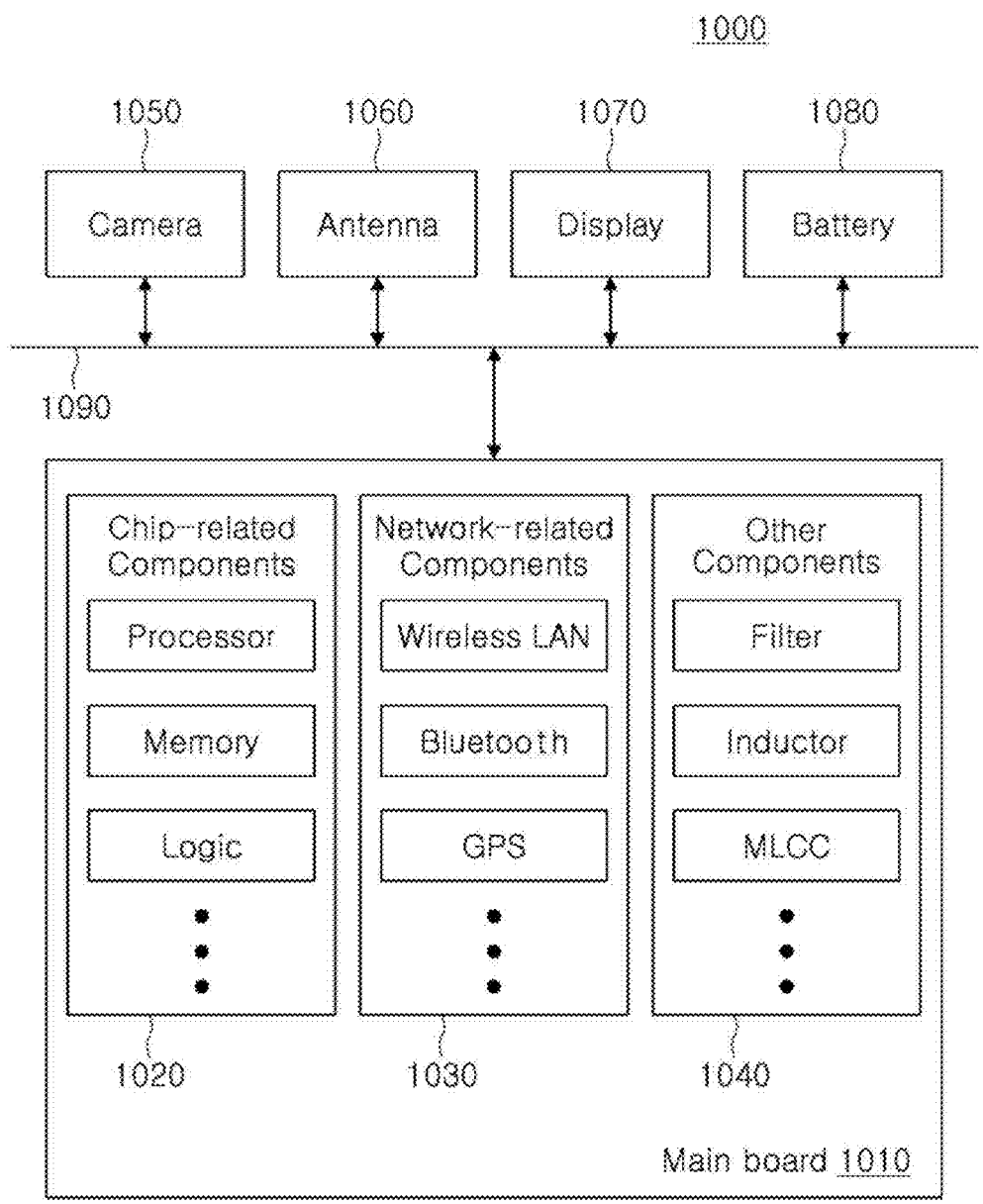
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
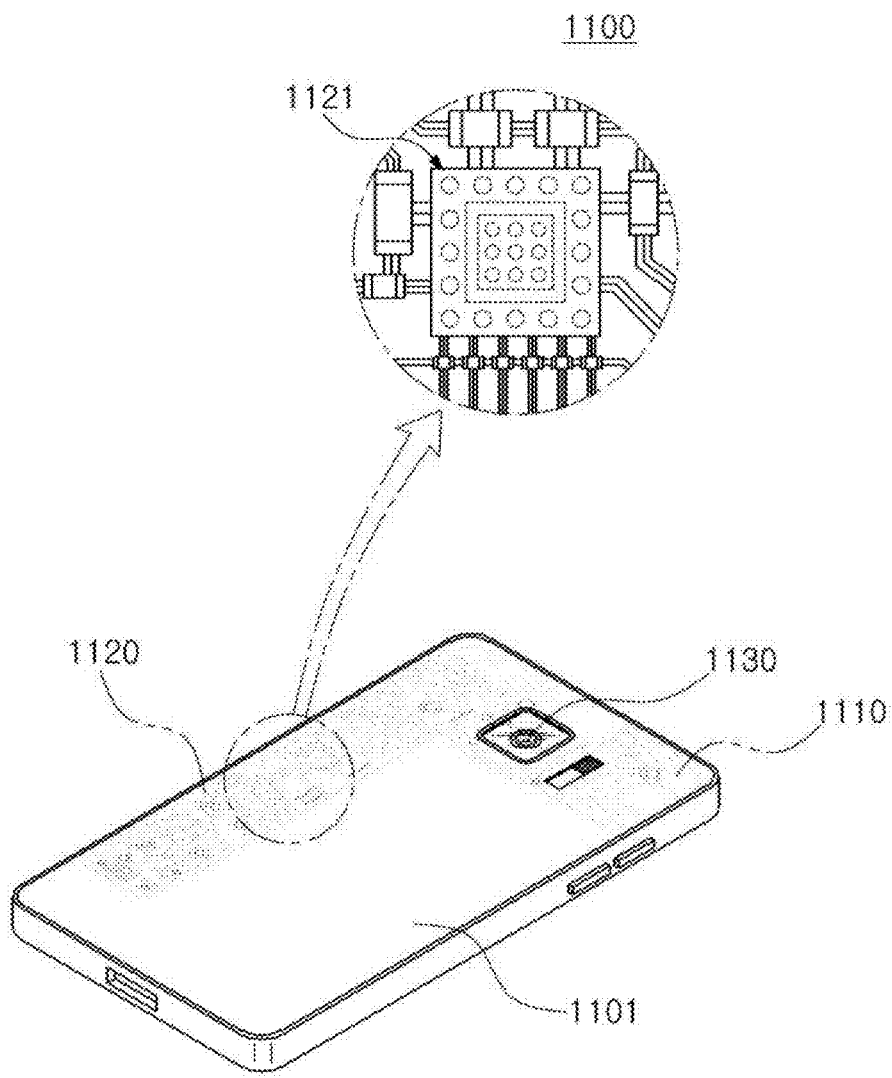
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
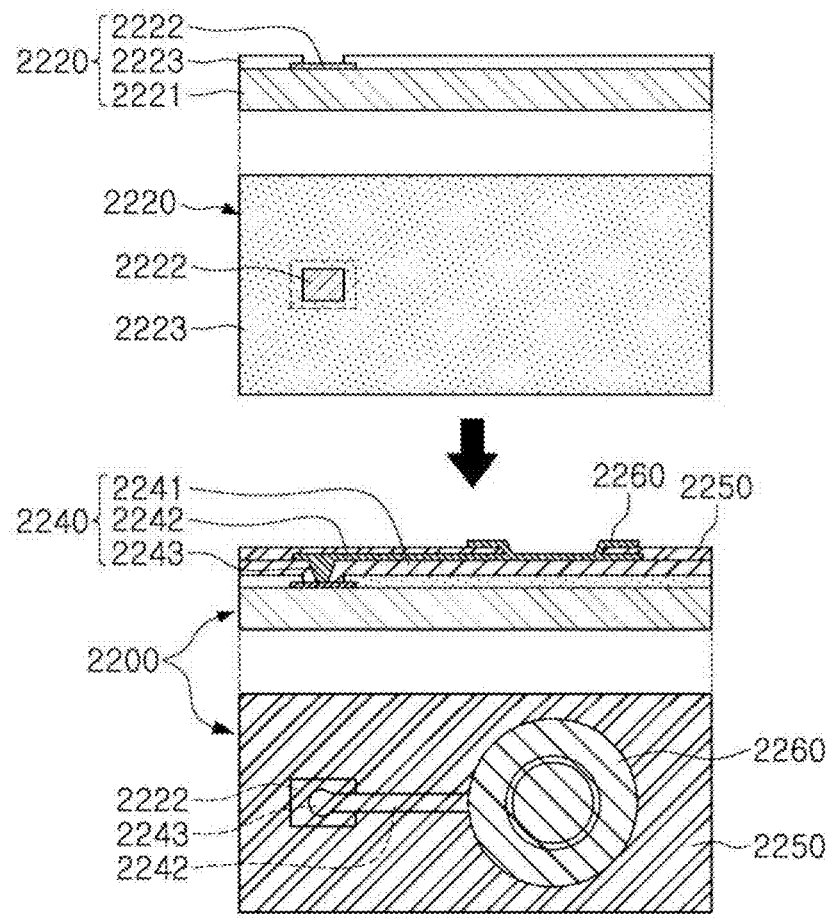
FIGS. 3A and 3B are schematic cross-sectional views illustrating states of a fan-in semiconductor package before and after being packaged.
Figure 3B:
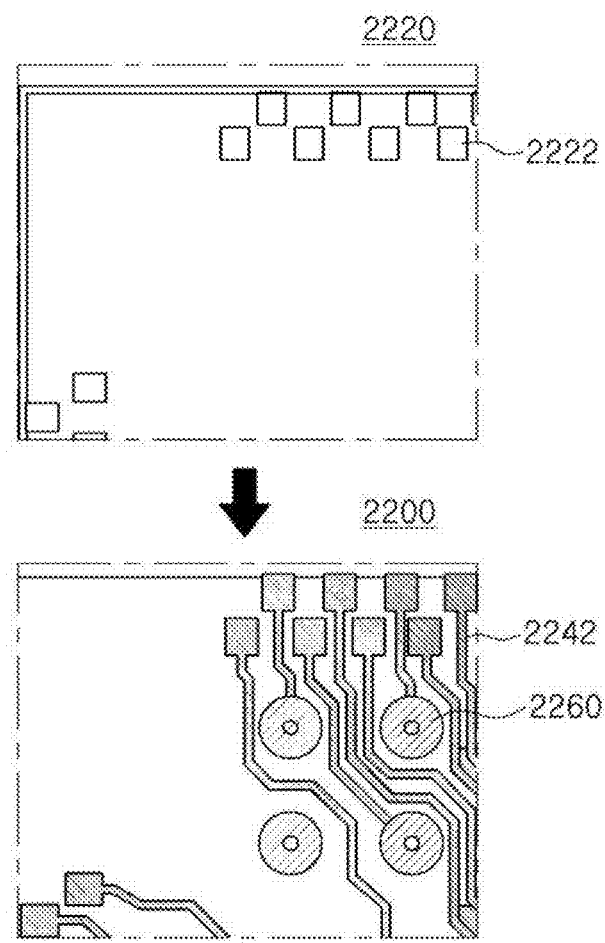

FIGS. 3A and 3B are schematic cross-sectional views illustrating states of a fan-in semiconductor package before and after being packaged.

Figure 4:
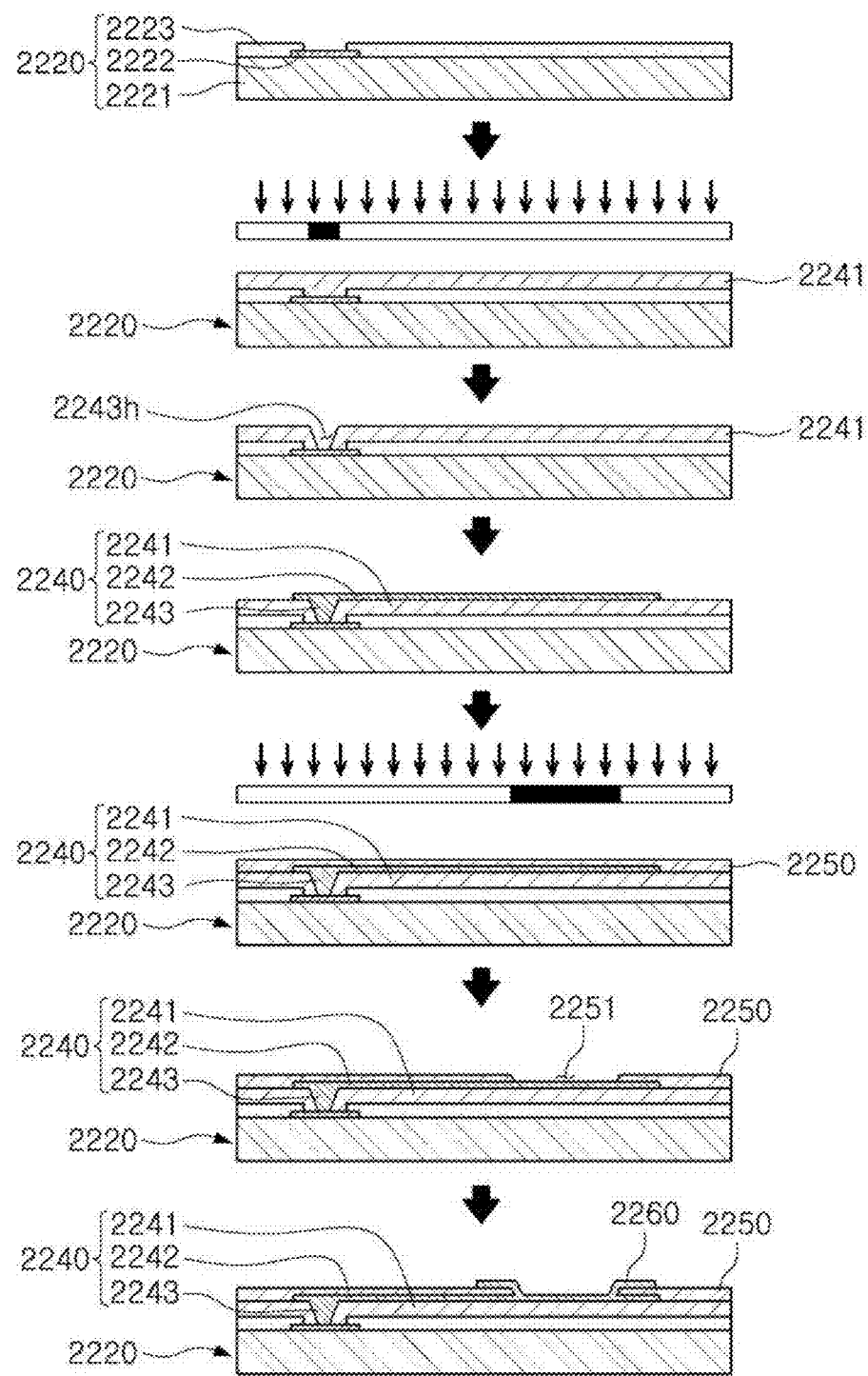
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243*h* opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
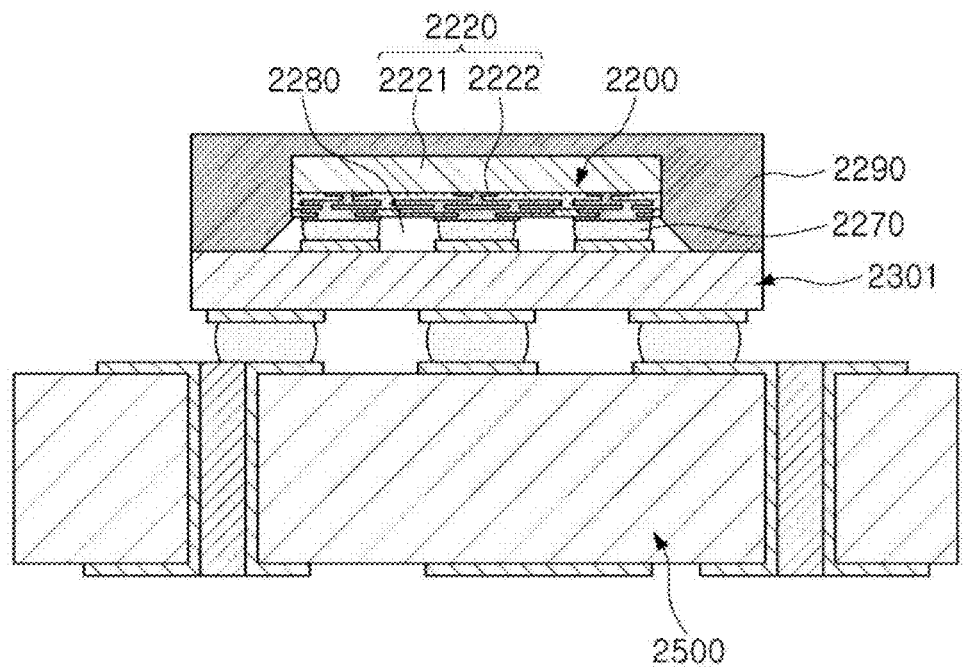
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
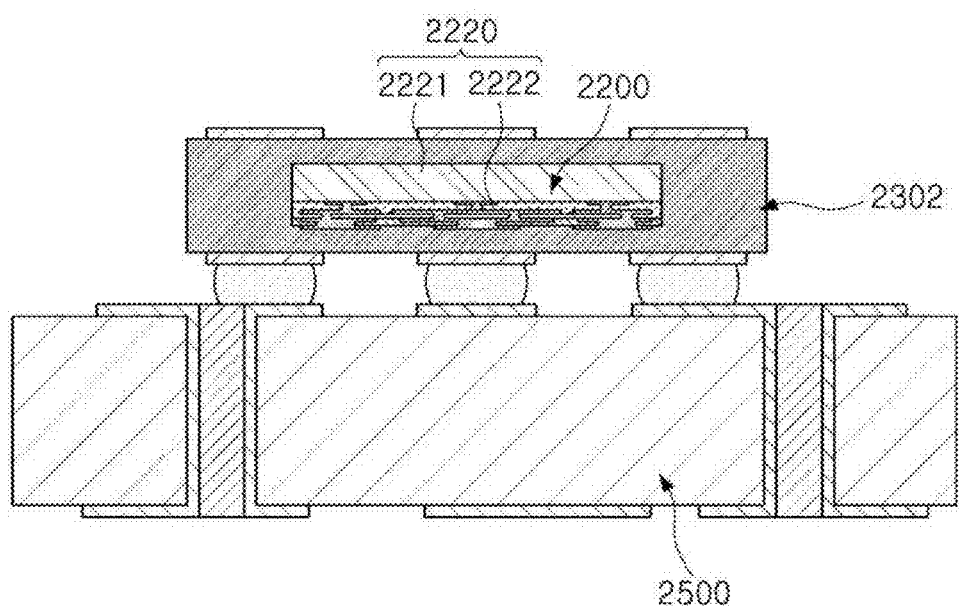
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
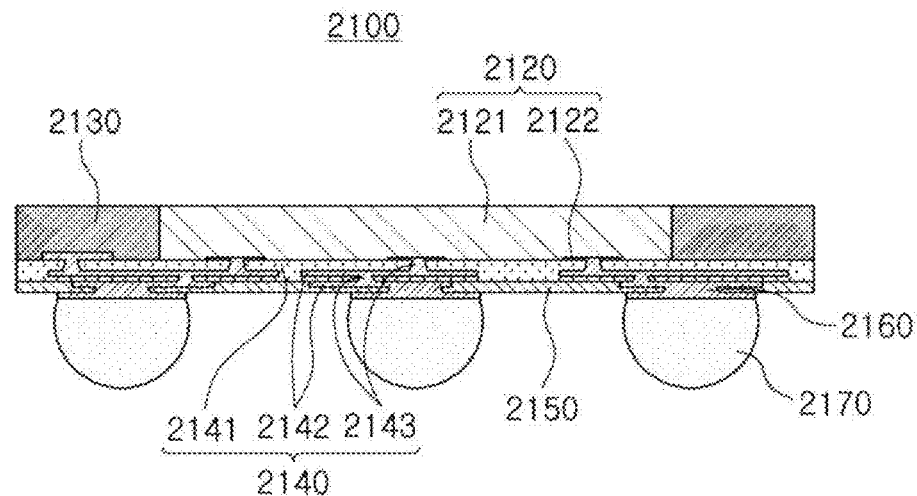
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
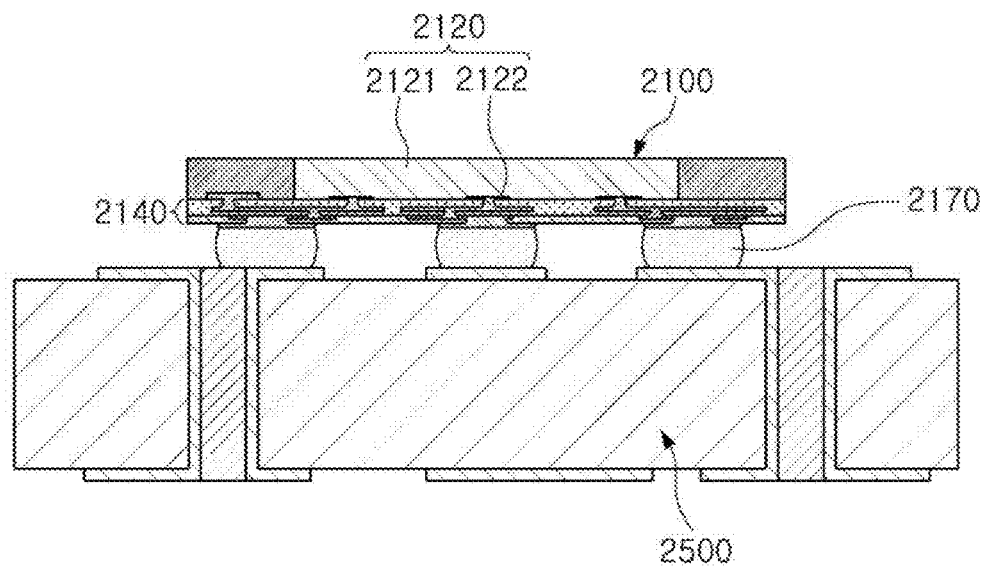
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
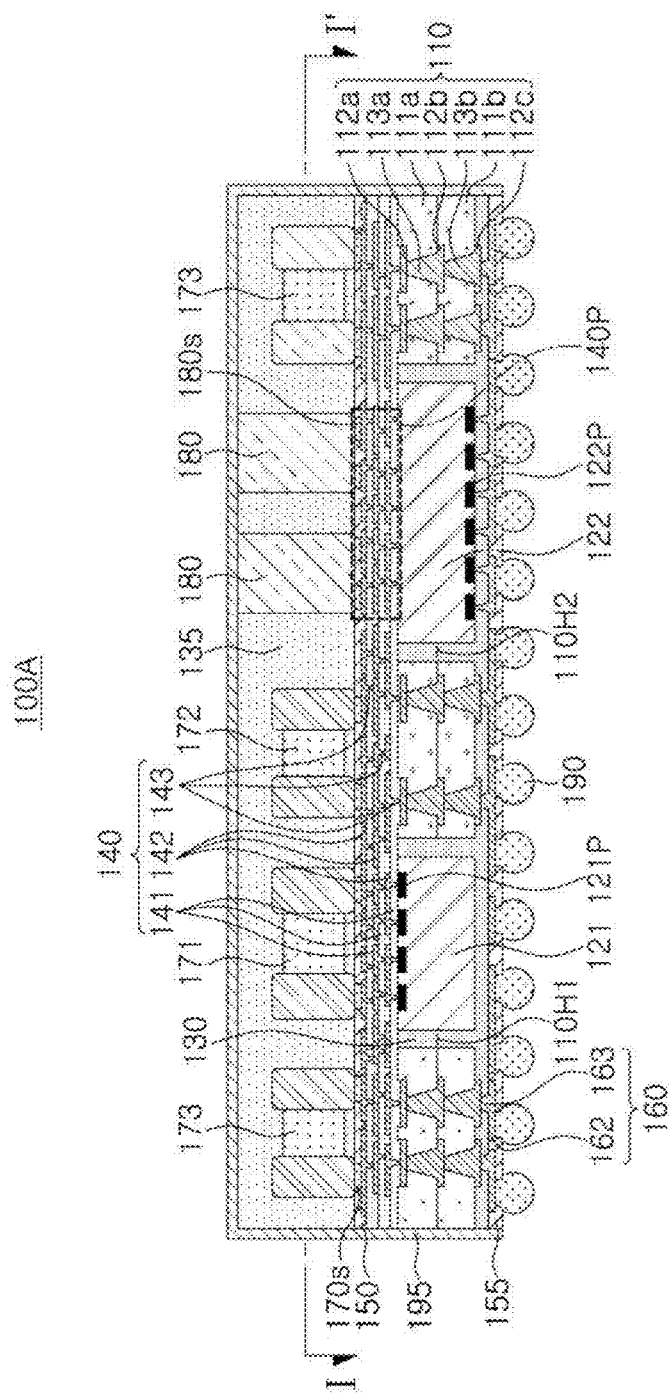
FIG. 9 is a schematic cross-sectional view illustrating an example of a semiconductor package.

FIG. 9 is a schematic cross-sectional view illustrating an example of a semiconductor package.

Figure 10:
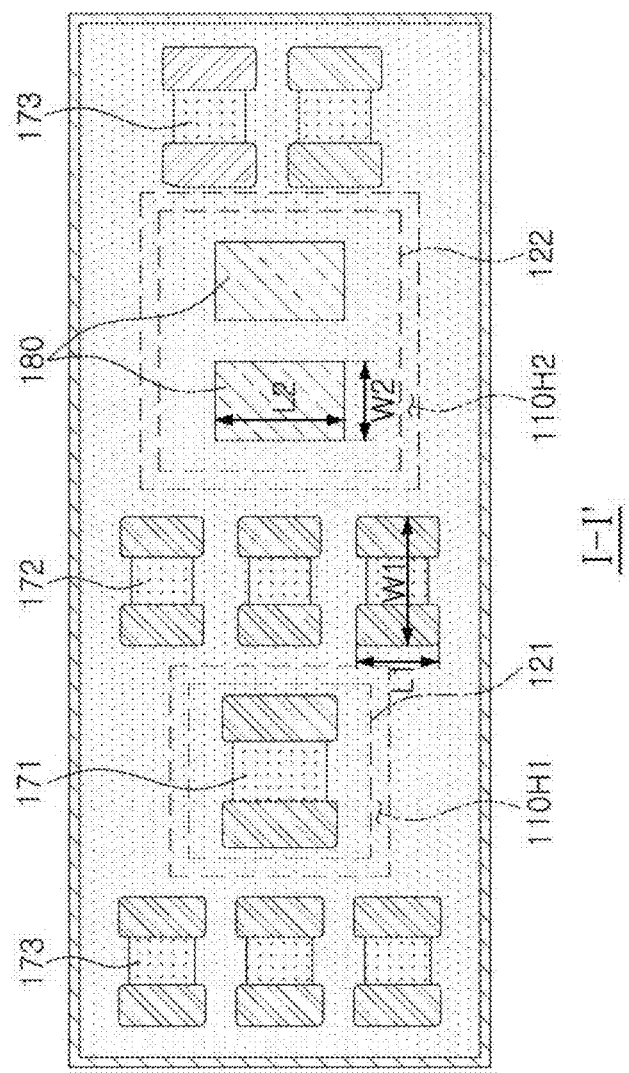
FIG. 10 is a schematic cutaway plan view taken along line I-I' of a semiconductor package of FIG. 9.

FIG. 10 is a schematic cutaway plan view taken along line I-I' of a semiconductor package of FIG. 9;

Referring to FIGS. 9 and 10, a semiconductor package 100A includes a frame 110 having first and second through-portions 110H1 and 110H2, a first semiconductor chip 121, disposed in the first through-portion 110H1 of the frame 110, having an active surface, on which a connection pad 121P is disposed, and an inactive surface opposing the active surface, a second semiconductor chip 122, disposed in the second through-portion 110H2, having an active surface, on which a connection pad 122P is disposed, and an inactive surface opposing the active surface, a first encapsulant 130 encapsulating at least one portion of the frame 110 and the first and second semiconductor chips 121 and 122, a first connection member 140, disposed on a top surface of the frame 110, the active surface of the first semiconductor chip 121, and the inactive surface of the semiconductor chip 122, including at least one redistribution layer 142 and a heat dissipation pattern layer 140P, one or more passive components 171, 172, and 173 mounted on a top surface of the first connection member 140, at least one heat dissipation structure 180 mounted on an upper portion of the semiconductor chip 122 on a top surface of the first connection member 140, a second encapsulant 135 encapsulating the passive components 171, 172, and 173 and the heat dissipation structure 180, a metal layer 195 covering a top surface and side surfaces of the second encapsulant 135, a second connection member 160, disposed on a bottom surface of the frame 110, including a second redistribution layer 162, and an electrical connection metal 190 connected to the second redistribution layer 162.

The first and second semiconductor chips 121 and 122 may perform different functions to each other in the semiconductor package 100A and may be mounted such that the active surfaces thereof are disposed in different directions to each other. The first connection member 140 may face the active surface, on which the connection pad 121P of the first semiconductor chip 121 is disposed, and may face the inactive surface on which the connection pad 122P of the second semiconductor chip 122 is not disposed. For example, the first semiconductor chip 121 may be a power management integrated circuit (PMIC) chip, and the second semiconductor chip 122 may be a radio-frequency integrated circuit (RFIC) chip. In this case, the first semiconductor chip 121 may transfer power to the passive components 171, 172, and 173 through a shortest and optimal signal path, and the second semiconductor chip 122 may be disposed to transmit and receive a signal to and from an external device, on which the semiconductor package 100A is mounted, for example, an antenna substrate in an antenna module through an optimal signal path.

The first semiconductor chip 121 may be electrically connected to the passive components 171, 172, and 173, including a first passive component 171 directly overlying, through the first connection member 140 disposed on the first semiconductor chip 121. Specifically, the first semiconductor chip 121 may be directly physically and electrically connected to a first via 143 of the first connection member 140 through the connection pad 121P to be electrically connected to the overlying passive components 171, 172, and 173. The second semiconductor chip 122 may be directly physically and electrically connected to a second via 163 of the second connection member 160 through the connection pad 122P to be electrically connected to the external device. The second semiconductor chip 122 may be connected to the heat dissipation pattern layer 140P of the overlying first connection member 140, and the heat dissipation pattern layer 140P may be connected to the heat dissipation structure 180 on the first connection member 140. The passive components 171, 172, and 173 and the heat dissipation structure 180 may be mounted on the first connection member 140 using, for example, a surface mounting technology (SMT), but a mounting technology thereof is not limited thereto.

In semiconductor packages according to related arts, electronic components such as semiconductor chips and passive components are disposed side by side. In this case, a space, in which each component is disposed, is required to increase a package size, in detail, an area on a plane. Additionally, when a semiconductor package includes a plurality of semiconductor chips performing different functions to each other, a signal is not efficiently transmitted between the plurality of semiconductor chips and a passive component or an external device and heat, generated by the plurality of semiconductor chips, is not efficiently discharged outwardly of the semiconductor package.

Meanwhile, in the semiconductor package 100A according to an example embodiment, a plurality of electronic components are disposed in a manner of being distributed above and below the first connection member 140. Specifically, the first connection member 140 is disposed such that the passive components 171, 172, and 173 are mounted on a surface of the first connection member 140, opposing a surface connected to the first and second semiconductor chips 121 and 122, and at least a portion of the passive components 171, 172, and 173 overlaps the first semiconductor chip 121 on a plane. Accordingly, a size of the semiconductor package 100A may decrease by an overlapping width of the first semiconductor chip 121 and the passive components 171, 172, and 173. In addition, at least a portion of the passive components 171, 172, and 173, including the first passive component 171, may be disposed above the first semiconductor chip 121 to optimize a signal transmission path and/or a power transmission path between the first semiconductor chip 121 and the passive components 171, 172, and 173.

Moreover, in the semiconductor package 100A, the heat dissipation 180 may be mounted on the first connection member 140 side by side with the passive components 171, 172, and 173. The heat dissipation structure 180 may discharge heat, generated from the second semiconductor chip 122, outwardly of the semiconductor package 100A through the heat dissipation pattern layer 140P of the first connection member 140. For example, a heat transfer path, connected from the second semiconductor chip 122 to the heat dissipation structure 180 through the heat dissipation pattern layer 140P of the first connection member 140, may be formed. Specifically, the heat dissipation structure 180 may be directly connected to the metal layer 195, constituting a top surface and side surfaces of the semiconductor package 100A, to have more effective heat dissipation functions.

Hereinafter, each component, included in the semiconductor package 100A according to an example embodiment, will be described in detail.

The frame 110 may have the first and second through-portions 110H1 and 110H2, each being in the form of a through-hole, the first semiconductor chip 121 may be disposed in the first through-portion 110H1 such that a surface, to which the connection pad 121P is connected, faces a bottom surface of the first connection member 140, and the second semiconductor chip 122 may be disposed in the second through-portion 110H2 such that a surface, on which the connection pad 122P is not disposed, faces the bottom surface of the first connection member 140. In this case, the first connection pad 121P may be connected to the first via 143 of the first connection member 140 without an additional bump. The frame 110 includes a first frame insulating layer 111a disposed in contact with a bottom surface of the first connection member 140, a first wiring layer 112a disposed in contact with a bottom surface of the first connection member 140 and embedded in the first frame insulating layer 111a, a second wiring layer 112b disposed on a side opposing a side of the first frame insulating layer 111a in which the first wiring layer 112a is embedded, a second frame insulating layer 111b, disposed on a side opposing a side of the first frame insulating layer 111a in which the first wiring layer 112a is embedded, covering at least a portion of the second wiring layer 112b, a third wiring layer 112c disposed on a side opposing a side of the second frame insulating layer 111b in which the second wiring layer 112b is embedded, a first wiring via 113c penetrating through the first frame insulating layer 111a and electrically connecting the first and second wiring layers 112a and 112b to each other, and a second wiring via 113c penetrating through the second frame insulating layer 111b and electrically connecting the second and third wiring layers 112b and 112c. The frame 110 may serve as a support member.

The first wiring layer 112a may be recessed into the first frame insulating layer 111a. For example, a surface of the first frame insulating layer 111a, disposed in contact with the bottom surface of the first connection member 140, may have a step with respect to a surface of the first wiring layer 112a disposed in contact with a bottom surface of the first connection member 140. In this case, when the first and second semiconductor chips 121 and 122 and the frame 110 are encapsulated by the encapsulant 130, contamination of the first wiring layer 112a, caused by bleeding of an encapsulant material, may be prevented. Each of the first and to third wiring layers 112a, 112b, and 112c may have a thickness greater than a thickness of the first redistribution layer 142.

Some pads of the first wiring layer 112a may serve as a stopper when a hole for the first wiring via 113a is formed. Accordingly, it may be advantageous in process that each connection via of the first connection wiring via 113a has a tapered shape in which an upper surface has a width smaller than a width of a lower surface. In this case, a wiring via of the first wiring via 113a may be integrated with a pad pattern of the second wiring layer 112b. Similarly, some pads of the second wiring layer 112b may serve as a stopper when a hole for the second wiring via 113a is formed. Accordingly, it may be advantageous in process that a wiring via of the second wiring via 113a has a tapered shape in which an upper surface has a width smaller than a width of a lower surface. In this case, a wiring via of the second wiring via 113b may be integrated with a pad pattern of the third wiring layer 112c.

A material of the first and second frame insulating layers 111a and 111b may be an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like.

The first to third wiring layers 112a, 112b, and 112c may serve to redistribute the connection pads 121P and 122P of the first and second semiconductor chips 121 and 122 and may serve to provide a pad pattern for the wiring vias 113a and 113b for upper/lower electrical connection of the package 100A. A material of the first to third wiring layers 112a, 112b, and 112c may be a metal material such as copper (Cu), aluminum (Al), silver (Ag), tin (Sn), gold (Au), nickel (Ni), lead (Pb), titanium (Ti), or alloys thereof. The first to third wiring layer 112a, 112b, and 112c may perform various functions depending on a design of a corresponding layer. For example, the wiring layers 112a, 112b, and 112c may include ground (GND) patterns, power (PWR) patterns, signal (S) patterns, and the like. The signal (S) patterns may include various signals, such as data signal, except for the ground (GND) patterns, the power (PWR) patterns, and the like.

The first and second wiring vias 113a and 113b may electrically connect the first to third wiring layers 112a, 112b, and 112c, formed on different layers to each other, resulting in an electrical path formed in the frame 110. In addition, the first and second wiring vias 113a and 113b may form an electrical path between the first connection member 140 and the electrical connection metal 190. A material of the first and second wiring vias 113a and 113b may be a metal material. Each of the first and second wiring vias 113a and 113b may be a filled via, completely filled with a metal material, or a conformal via in which a metal material is formed along a wall surface of a via hole. Each of the first and second wiring vias 113a and 113b may have a tapered shape. The first and second wiring vias 113a and 113b may be integrated with at least a portion of the first to third wiring layers 112a, 112b, and 112c, but the integration thereof is not limited thereto.

Each of the semiconductor chips 121 and 122 may be an integrated circuit (IC) in which several hundred to several million or more elements are integrated in a single chip. The IC may be, for example, a processor chip such as a power management IC (PMIC), a radio-frequency IC (RFIC), a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, each of the semiconductor chips 121 and 122 is not limited thereto, and may be a logic chip such as an analog-to-digital converter, an application-specific IC (ASIC), or the like, or a memory chip such as a volatile memory (for example, a dynamic random access memory (DRAM)), a nonvolatile memory (for example, a read only memory (ROM) or a flash memory, or the like, but is not limited thereto. Moreover, the chip-related components may be combined with each other.

In the semiconductor chips 121 and 122, surfaces, on which connection pads 121 and 122 are disposed, are respectively active surfaces, and opposing surfaces are respectively inactive surfaces. The semiconductor chips 121 and 122 may be formed based on an active wafer. In this case, a base material of a body portion may be silicon (Si), germanium (Ge), gallium arsenide (GaAs), or the like. Various circuits may be formed on the body portion. The connection pads 121P and 122P may electrically connect the semiconductor chips 121 and 122 to other components. A material of each of the connection pads 121P and 122P may be a conductive material such as aluminum (Al), or the like. A passivation layer 123 may be formed on the body portion to expose the connection pads 121P and 122P, and may be an oxide layer, a nitride layer, or the like, or a double layer of an oxide layer and a nitride layer.

The encapsulant 130 may encapsulate the semiconductor chips 121 and 122 while filling at least a portion of the through-portions 110H1 and 110H2. An encapsulation form of the encapsulant 130 is not limited as long as the encapsulant 130 surrounds at least a portion of the semiconductor chips 121 and 122. For example, the encapsulant 130 may cover at a least a portion of the frame 110, the inactive surface of the first semiconductor chip 121, and the active surface of the second semiconductor chip 122, and may fill a portion of spaces between wall surfaces of the first and second through-portions 110H1 and 110H2 and sidewalls of the first and second semiconductor chips 121 and 122. The encapsulant 130 may fill the through-portions 110H1 and 110H2, serving as an adhesive for fixing the semiconductor chips 121 and 122 and serving to reduce buckling depending on certain materials. The encapsulant 130 may include a detailed material. The encapsulant 130 includes an insulating material which may be a material including an inorganic filler and an insulating resin, for example, a thermosetting resin such as an epoxy resin, a thermoplastic resin such as a polyimide, or a resin in which a reinforcement such as an inorganic filler is included in the thermosetting resin or the thermoplastic resin, in detail, an Ajinomoto build-up film (ABF), an FR-4 resin, a bismaleimide triazine (BT) resin, a resin, or the like. In addition, EMC, PIE, or the like, may be used. As necessary, a material in which an insulating resin such as the thermosetting resin or the thermoplastic resin is impregnated in a core material such as an inorganic filler and/or a glass fiber, may be used.

The first connection member 140 may redistribute the connection pads 121P and 122p of the semiconductor chips 121 and 122. In addition, the first connection member 140 may electrically connect the connection pads 121P and 122P to the wiring layers 112a, 112b, and 112c depending on functions. Several tens to several hundreds of connection pads 121P and 122P of the semiconductor chip 120, having various functions, may be redistributed by the first connection member 140, and may be physically and/or electrically externally connected through the electrical connection metal 190 depending on functions thereof. The first connection member 140 may include a first insulating layer 141, a first redistribution layer 142 disposed on the insulating layer 141, and a first via 141 penetrating through the insulating layer 141. The first connection member 140 may include a greater number of insulating layers 141, first redistribution layers 142, and first vias 143 than illustrated in the drawings. Alternatively, the first connection member 140 may include a smaller number of insulating layers 141, first redistribution layers 142, and first vias 143 than illustrated in the drawings.

A material of the insulating layer 141 may be an insulating material. In this case, the insulating material may be a photosensitive insulating material such as a photoimageable dielectric (PID) resin, other than the above-described insulating materials. For example, the insulating layer 141 may be a photosensitive insulating layer. When the insulating layer 141 has photosensitive properties, the insulating layer 141 may be formed to have a smaller thickness and a fine pitch of the first via 143 may be achieved more easily. The insulating layer 141 may be a photosensitive insulating layer including an insulating resin and an inorganic filler. When the insulating layer 141 includes multiple layers, materials thereof may be the same as each other or may be different from each other, as necessary. When the insulating layer 141 includes multiple layers, they may be integrated with each other depending on a process, such that a boundary therebetween may not be apparent, but the integration thereof is not limited thereto.

The first redistribution layer 142 may serve to substantially redistribute the connection pads 121P and 122P and may provide the above-mentioned electrical connection path. A material of the first redistribution layer 142 may be a conductive material such as copper (Cu), aluminum (Al), silver (Ag), tin (Sn), gold (Au), nickel (Ni), lead (Pb), titanium (Ti), or alloys thereof. The first redistribution layer 142 may perform various functions depending on design of a corresponding layer. For example, the first redistribution layer 142 may include a ground (GND) pattern, a power (PWR) pattern, a signal (S) pattern, and the like. The signal (S) pattern may include various signals, such as data signals, except for the ground (GND) signals, the power (PWR) signals, and the like. The pattern includes a wiring and pad. In detail, the first redistribution layer 142 may include a heat dissipation redistribution layer, constituting a heat dissipation pattern layer 140P, in a region overlapping the second semiconductor chip 122.

The first via 143 may be connected to the first redistribution layer 142, the connection pad 121P, and the uppermost first wiring layer 112a to electrically connect the first redistribution layer 142, the connection pad 121P, and the wiring layers 112a, 112b, and 112c, disposed on different layers to each other, resulting in an electrical path formed in the first connection member 140. The first via 143 may mainly includes a heat dissipation via, constituting a heat dissipation pattern layer 140P, in a region overlapping the second semiconductor chip 122. A material of the first vias 143 may be a metal material such as copper (Cu), aluminum (Al), silver (Ag), tin (Sn), gold (Au), nickel (Ni), lead (Pb), titanium (Ti), or alloys thereof. In detail, the first via 143 may be a photo via formed in the insulating layer 141, having photosensitive properties, by a photolithography process. In this case, the first via 143 may be a filled via, completely filled with a metal material, or a conformal via in which a metal material is formed along a wall surface of a via hole. The first via 143 may be a tapered cross-sectional shape. A tapering direction of the first via 143 may be different from a tapering direction of the wiring vias 113a and 113b of the frame 110.

A second connection member 160, including a second redistribution layer and a second via 163, may be disposed at a lower side of the first encapsulant 130. The second via 163 may penetrate through at least a portion of the first encapsulant 130 to electrically connect the third wiring layer 112c and the second redistribution layer 162 to each other. The second via 163 may penetrate through at least another portion of the first encapsulant 130 to electrically connect the connection pad 122P of the second semiconductor chip 122 and the second redistribution layer 162 to each other. In detail, the second semiconductor chip 112 may be electrically connected to an external device, in which the semiconductor package 100A is mounted, for example, an antenna substrate through the second connection member 160 and the electrical connection metal 190 in a shortest path.

The second redistribution layer 162 may also serve to redistribute the connection pads 121P and 122P and may serve to provide the above-mentioned electrical connection path. A material of the second redistribution layer 162 may be a conductive material such as copper (Cu), aluminum (Al), silver (Ag), tin (Sn), gold (Au), nickel (Ni), lead (Pb), titanium (Ti), or alloys thereof. The second redistribution layer 162 may perform various functions depending on a design of a corresponding layer. For example, the second redistribution layer 162 may include ground (GND) patterns, power (PWR) patterns, signal (S) patterns, and the like. The signal (S) patterns may include various signals, such as data signal, except for the ground (GND) patterns, the power (PWR) patterns, and the like. The pattern includes a wiring and pad.

The second via 163 may electrically connect the third wring layer 112c and the second redistribution layer 162 to each other. A material of the second vias 163 may also be a metal material such as copper (Cu), aluminum (Al), silver (Ag), tin (Sn), gold (Au), nickel (Ni), lead (Pb), titanium (Ti), or alloys thereof. In detail, the second via 163 may be a laser via formed by a laser drilling process to penetrate through the first encapsulant 130, a non-photosensitive material. In this case, the second via 163 may include a seed layer including a material, different from the material of the first via 143, for example, copper (Cu). Accordingly, the second via may have a diameter greater than a diameter of the first via 143. The second via 163 may be a filled via, filled with a metal material, or a conformal via in which a metal material is formed along a wall surface of a via hole. The second via 163 may have a tapered cross-sectional shape. A tapering direction of the second via 163 may be the same as a tapering direction of a wiring via of each of the first and second wiring vias 113a and 113b and may be different from the tapering direction of the first via 143. In example embodiments, the number of second redistribution layers 162 and the number of second vias 163 may be variously modified.

The first and second passivation layers 150 and 155 may be additionally configured to protect the first connection member 140 and the second connection member 160 from external physical or chemical damage, respectively. Each of the first and second passivation layers 150 and 155 may include a thermosetting resin. For example, each of the first and second passivation layers 150 and 155 may be an ABF, but is not limited thereto. Each of the first and second passivation layers 150 and 155 may have a plurality of openings exposing at least a portion of the first and second redistribution layers 142 and 162. The openings may be provided in an amount of several tens to several thousands or more or several tens to several thousands or less. Each opening may include a plurality of holes.

The passive components 171, 172, and 1723 may be electrically connected to an uppermost first redistribution layer 142 of the first connection member 140 through a bump 170s. Each of the passive components 171, 172, and 173 may independently be a capacitor such as a multilayer ceramic capacitor (MLCC), a low inductance chip capacitor (LICC), or an inductor such as a power inductor, a bead, or the like. The first passive component 171 may be disposed on a plane to overlap the first semiconductor chip 121, and the second and third passive components 172 and 173 may be disposed on a plane to overlap the frame 110, or may be disposed such that some regions thereof overlap the first semiconductor chip 121, depending on example embodiments. For example, at least a portion of the first passive component 171 may be disposed in a region formed directly above the first semiconductor chip 121, and at least a portion of the second and third passive components 172 and 173 may be disposed in a region formed directly above the frame 110. The passive components 171, 172, and 173 may have different sizes and thicknesses to each other. In addition, the passive components 171, 172, and 173 may have thicknesses different from thicknesses of the first and second semiconductor chips 121 and 122. In the semiconductor package 100A according to an example, the passive components 171, 172, and 173 and the first and second semiconductor chips 121 and 122 may be encapsulated in different processes, and thus, a defect caused by such a thickness deviation may be significantly reduced. The number of the passive components 171, 172, and 173 is not limited, and may be more or less than that illustrated in the drawings. In addition, the number of passive components 171, 172, and 173, disposed directly above the first semiconductor chip 121, is not limited to that illustrated in the drawings.

The heat dissipation structure 180 may be connected to the uppermost first redistribution layer 142 through a bump 180s. The heat dissipation structure 180 may have a block shape. For example, the heat dissipation structure 180 may have a rectangular parallelepiped shape. In detail, the heat dissipation structure 180 may have the same size as at least one of the passive components 171, 172, and 173, for example, the second passive component 172 on at least a plane. As illustrated in FIG. 10, the second passive component 172 may have a first width W1 and a first length L1 in two directions, perpendicular to each other, and the heat dissipation structure 180 may have a second width W2 substantially equal to the first length L1 and a second length L2 substantially equal to the first width W1. For example, the heat dissipation structure 180 may have a size obtained by rotating the second passive structure 172 at an angle of 90 degrees. In this case, the heat dissipation structure 180 may be mounted together with the second passive component 172 during mounting of the second passive component 172 to simplify a manufacturing process. However, the size of the heat dissipation structure 180 is not limited thereto. The heat dissipation structure 180 may be formed of a material having a relatively high thermal conductivity to effectively perform a heat dissipation function. For example, the heat dissipation structure 180 may include a metal material such as copper (Cu), aluminum (Al), silver (Ag), tin (Sn), gold (Au), nickel (Ni), lead (Pb), titanium (Ti), or alloys thereof. Alternatively, the heat dissipation structure 180 may include at least one of a silicon carbide (SiC), graphite, graphene, carbon nanotubes (CNT), and a metal-graphite composite material. The heat dissipation structure 180 may have a lower portion, connected to the heat dissipation pattern layer 140P of the first connection member 140, and an upper portion connected to the metal layer 195.

The second encapsulation member 135 encapsulates at least a portion of top surfaces of the one or more passive components 171, 172, and 173, the heat dissipation structure 180, and the first connection member 140. An encapsulation shape is not limited as long it covers at least a portion of the passive components 171, 172, and 173 and the heat dissipation structure 180 on the first connection member 140. The second encapsulation member 135 may cover at least a portion of a top surface, a bottom surface, and a side surface of each of the passive components 171, 172, and 173, and a side surface of the heat dissipation structure 180. The second encapsulant 135 may extend to the first connection member 140 to be disposed on the first connection member 140 and to be in contact with a top surface of the first redistribution layer 142. The second encapsulant 135 may include the same material as the first encapsulant 131 or may include a material different from a material of the first encapsulant 131.

The metal layer 195 may constitute a top surface and side surfaces of the semiconductor package 100A. The metal layer 195 may covers top and side surfaces of the second encapsulant 135 and may downwardly extend to cover the first passivation layer 150, the first connection member 140, the frame 110, the first encapsulation material 130, and a side surface of the second passivation layer 155. In detail, the metal layer 195 may be in contact with the heat dissipation structure 180 in a region constituting the top surface of the semiconductor package 100A to further improve heat dissipation of the package 100A. The metal layer 195 may be connected to the first rewiring layer 142 in a region, not illustrated, to receive a ground signal from the first connection member 140, but the present disclosure is not limited thereto. An electromagnetic interference (EMI) shielding function of the semiconductor package 100A may be further improved by the metal layer 195. The metal layer 195 includes a metal material such as copper (Cu), aluminum (Al), silver (Ag), tin (Sn), gold (Au), nickel (Pb), titanium (Ti), or alloys thereof. According to embodiments, the metal layer 195 may include a plurality of layers. However, the metal layer 195 is not an essential component, and may be omitted according to embodiments.

The electrical connection metal 190 is an additional component and is configured to physically and/or electrically connect the semiconductor package 100A to an external component. For example, the semiconductor package 100A may be mounted on a semiconductor module or a main board of an electronic device through the electrical connection metal 190. The electrical connection metal 190 is disposed on each of a plurality of openings of the second passivation layer 155. Therefore, the electrical connection metal 190 may be electrically connected to the exposed second rewiring layer 162. As necessary, an underbump metal may be formed in a plurality of openings in the second passivation layer 155. In this case, the second passivation layer 155 may be electrically connected to the exposed second redistribution layer 162 through the underbump metal. The electrical connection metal 190 may include a low melting point metal such as tin (Sn) or an Sn-containing alloy. More specifically, the electrical connection metal 190 may be formed of a solder or the like, but this is merely an example and a material of the electrical connection metal 190 is not limited thereto.

The electrical connection metal 190 may be a land, a ball, a pin, or the like. The electrical connection metal 190 may include multiple layers or a single layer. When the electrical connection metal 190 includes multiple layers, it may include a copper pillar and a solder. When the electrical connection metal 190 may include a tin-silver solder or metal. However, the electrical connection metal 190 also an example and is not limited thereto. The number, an interval, a disposition form, and the like, of electrical connection metal 190 are not limited, and may be sufficiently modified depending on design particulars by those skilled in the art. For example, the electrical connection metal 190 may be provided in an amount of several tens to several thousands, or may be provided in an amount of several tens to several thousands or more, or several tens to several thousands or less, depending on the number of connection pads 121P and 122P.

At least one of the electrical connection metals 190 may be disposed in a fan-out region. The term. "fan-out region" refers to a region except for a region in which the frit and second semiconductor chips 121 and 122 is disposed. For example, the semiconductor package 100A according to an example may be a fan-out semiconductor package. The fan-out package may have improved reliability as compared to a fan-in package, may allow a plurality of input/output (I/O) terminals to be implemented, and may facilitate a three-dimensional (3D) interconnection. In addition, as compared to a ball grid array (BGA) package, a land grid array (LGA) package, or the like, the fan-out package may be manufactured to have a small thickness, and may have superior price competitiveness.

FIGS. 11A to 11D are schematic cross-sectional views illustrating an example of a process of manufacturing a semiconductor package.

Figure 11A:
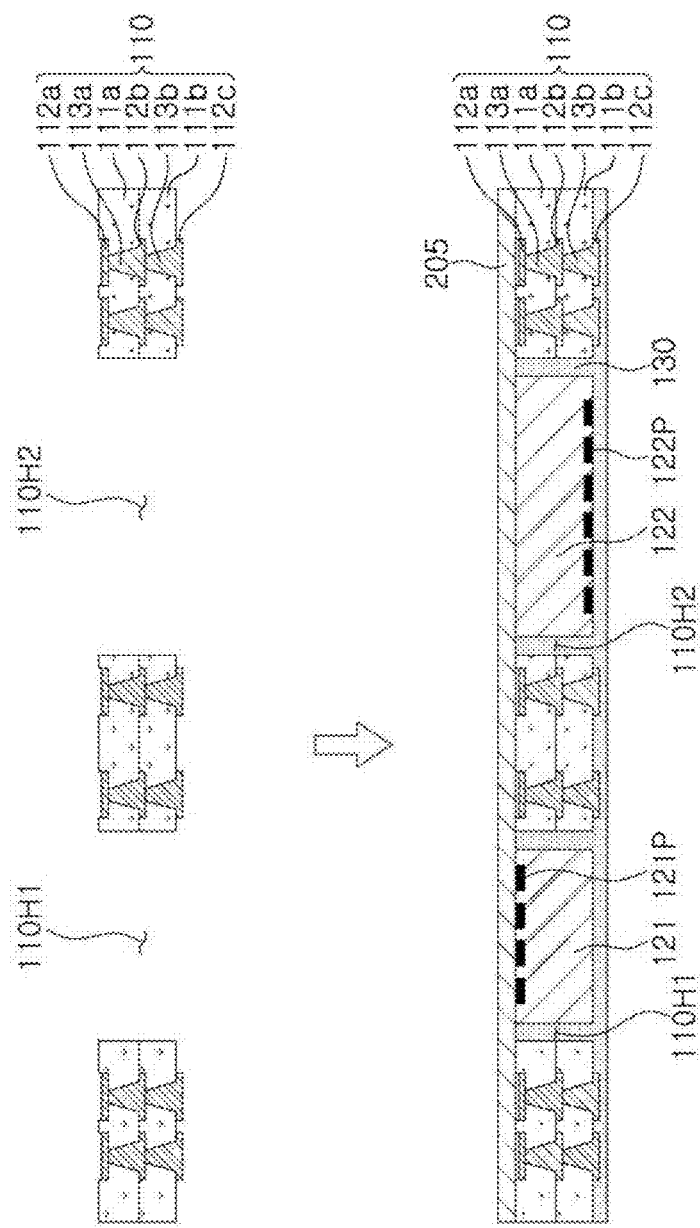
FIGS. 11A to 11D are schematic cross-sectional views illustrating an example of a process of manufacturing a semiconductor package.

Referring to FIG. 11A, a frame 110 is prepared, and first and second through-portions 110H1 and 110H2 are performed to penetrate through top and bottom surfaces of the frame 110. The first and second through-portions 110H1 and 110H2 may be formed by mechanical drilling and/or laser drilling. However, the formation of the first and second through-portions 110H1 and 110H2 is not limited thereto and may be performed by sandblasting using polishing powder particles, dry etching using plasma, or the like. Depending on the material of the frame 110, sizes and shapes of the first and second through-portions 110H1 and 110H2 are designed to match sizes, shapes, and numbers of the first and second semiconductor chips 121 and 122 to be mounted. Next, an adhesive film 205 is attached to one side of the frame 110, and first and second semiconductor chips 121 and 122 are disposed in the first and second through-portions 110H1 and 110H2, and an encapsulant 130 is formed. Any film may be used as the adhesive film 205 as long as it is able to fix the frame 110. As an unlimited example, the adhesive film 205 may be a heat-curable adhesive tape of which adhesion is weakened by a heat treatment, an ultraviolet-curable adhesive tape of which adhesion is weakened by irradiation of ultraviolet. The first and second semiconductor chips 121 and 122 are disposed in such a manner that they are attached to a surface of the adhesive film 205 in the first and second through-portions 110H1 and 110H2. For example, an active surface of the first semiconductor chip 121 is attached to the surface of the adhesive film 205, and an inactive surface of the second semiconductor chip 122 is attached to the surface of the adhesive film 205. The first encapsulant 130 encapsulates at least a bottom surface of the frame 110 and the first and second semiconductor chips 121 and 122 and fills a space in the first and second through-portions 110H1 and 110H2. The first encapsulant 130 may be formed by a known method, for example, by laminating a precursor of the first encapsulant 130 and curing the laminated precursor. Alternatively, the first sealing material 130 may be coated on the adhesive film so as to seal the first and second semiconductor chips 121 and 122, and then cured. The first and second semiconductor chips 121 and 122 are fixed by the curing.

Figure 11B:
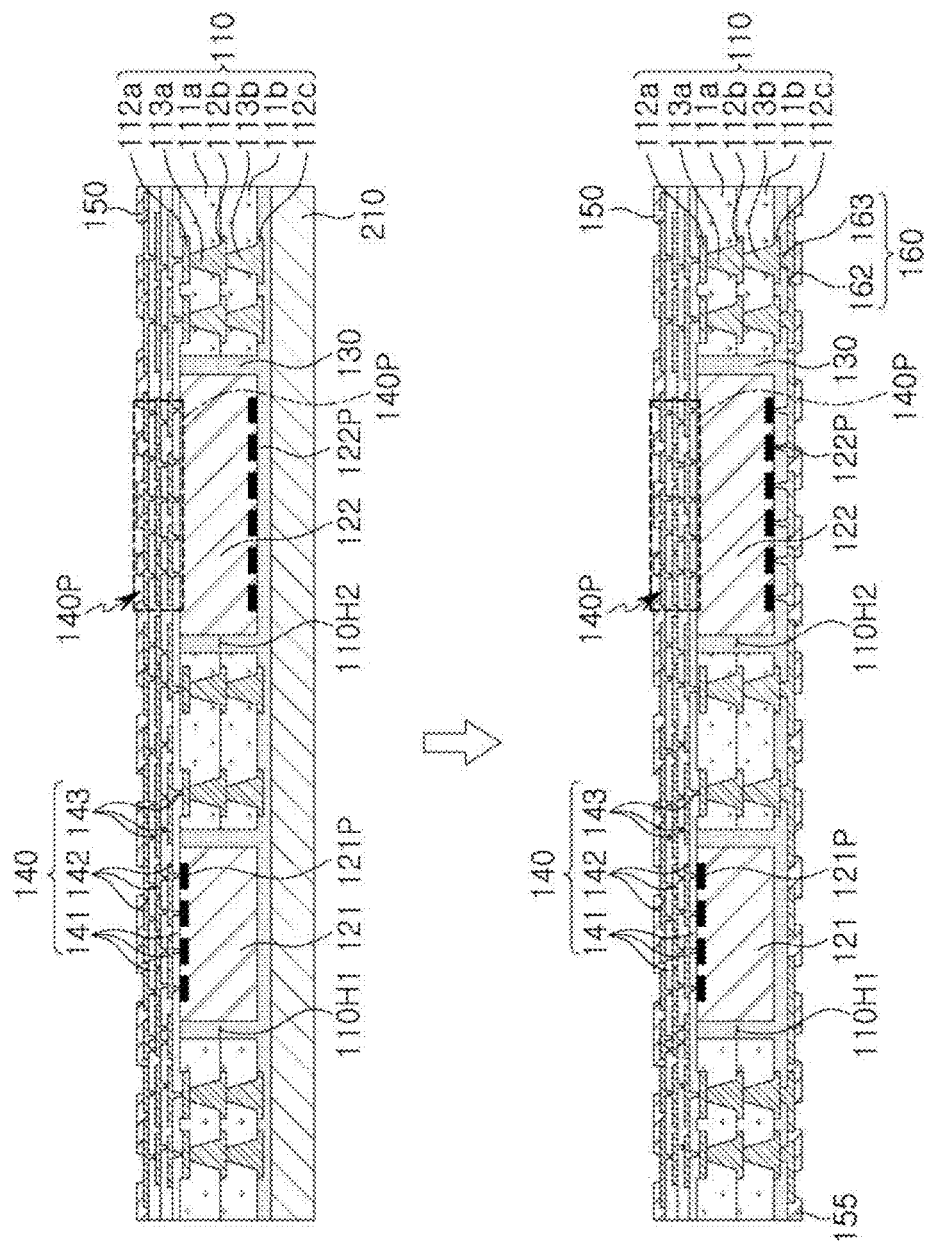

Referring to FIG. 11B, after a carrier substrate 210 is attached onto the first encapsulant 130, the adhesive film 205 is removed. A first connection member 140 and a first passivation layer 150 are formed on a surface from which the adhesive film 205 is removed. The first connection member 140 may be formed by forming an insulating layer 141, a first redistribution layer 142, and a first via 143. The first connection member 140 may be formed by sequentially insulating layers 141. Specifically, the first connection member 140 may be formed by forming the insulating layers 141 and the first redistribution layer 142 and the first via 143 on corresponding insulating layers thereof. In detail, the insulating layer 141 may be formed of a photosensitive material, and the first via 143 may be formed by forming a via hole using a photolithography process, forming a seed layer for plating, for example, a seed layer including titanium (Ti) using a dry process, and forming a plating layer using the seed layer. The first passivation layer 150 may be formed by a method of laminating a precursor of the first passivation layer 150 and curing the laminated precursor, a method of applying a material for forming the first passivation layer 150 and curing the applied precursor, or the like. Next, after the carrier substrate 210 is removed, a second redistribution layer 162 and a second via 163 are formed on a bottom surface of the first encapsulant 130 to form a second connection member 160 and a second passivation layer 155 is formed to cover the second connection member 160. In detail, the second vias 163 may be formed by forming via holes using laser drilling, forming a seed layer for plating, for example, a chemical copper seed layer, and forming a plating layer using the seed layer. The second passivation layer 155 may be formed to have an opening exposing at least a portion of the second redistribution layer 162.

Figure 11C:
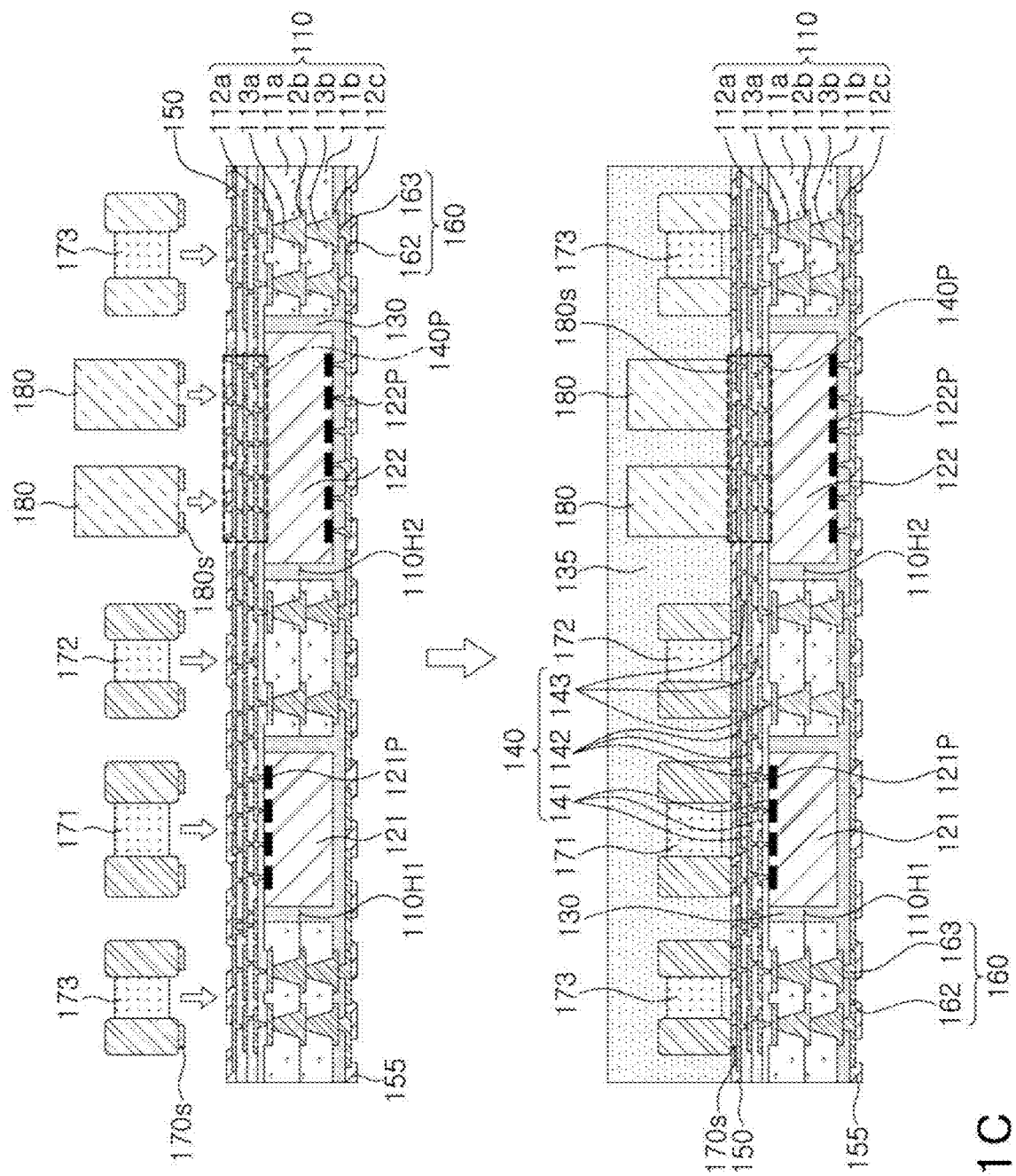

Referring to FIG. 11C, passive components 171, 172, and 173 and a heat dissipation structure 180 may be mounted on the first connection member 140. The passive components 171, 172, and 173 and the heat dissipation structure 180 may be mounted to be connected to the first redistribution layer 142 in the same surface mounting technology (SMT) using bumps 170s and 180s. In detail, the heat dissipation structure 180 may be mounted in the same process together with at least a portion of the passive components 171, 172, and 173, for example second passive components 172 having the same size. Next, a second encapsulant 135 may be formed to encapsulate the passive components 171, 172, and 173 and the heat dissipation structure 180. The second encapsulant 135 may encapsulate at least a portion of top, side, and bottom surfaces of the passive components 171, 172, and 173, may encapsulate top and side surfaces of the heat dissipation structure 180, and may fill spaces between the passive components 171, 172, and 173 and the heat dissipation structure 180. The second encapsulant 135 may be formed by a known method. For example, the second encapsulant 135 may be formed by the same method described as the method of forming the first encapsulant 130.

Figure 11D:
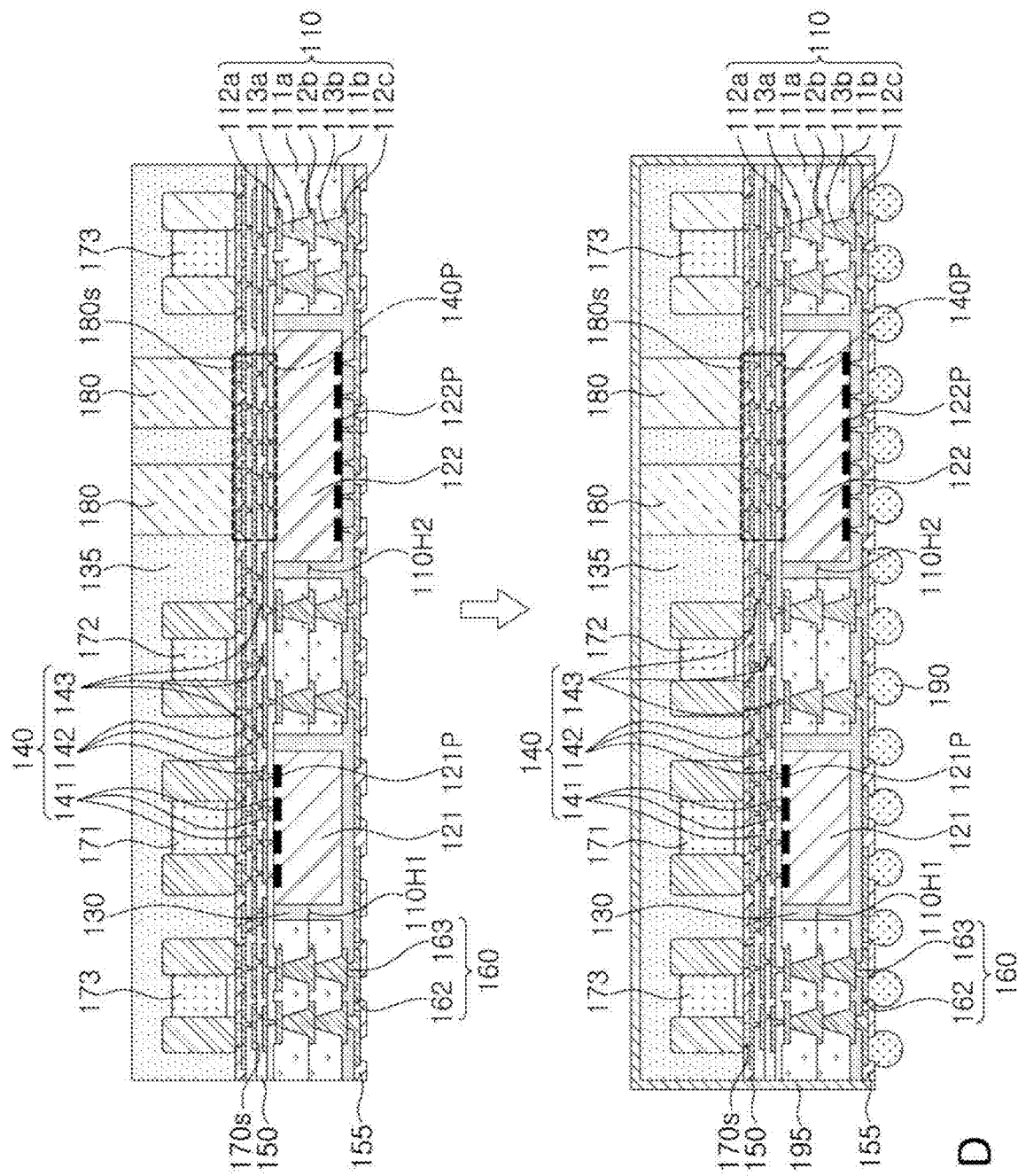

Referring to FIG. 11D, a portion of the second encapsulant 135 is removed to expose a top surface of the heat dissipation structure 180. Next, an electrical connection metal 190 is formed on the opening of the second passivation layer 155, and a metal layer 195 is formed to extend from a top surface of the second encapsulant 135. The electrical connection metal 190 may be fixed by, for example, reflowing and a portion of the electrical connection metal 190 may be embedded in the second passivation layer 155 and the other portion of the electrical connection metal 190 may be exposed outwardly to enhance the fixing force. Thus, reliability may be improved. An underbump metal layer may be further disposed above the electrical connection metal 190. The metal layer 195 may be formed to constitute top and side surfaces of the package using a process such as sputtering.

Figure 12:
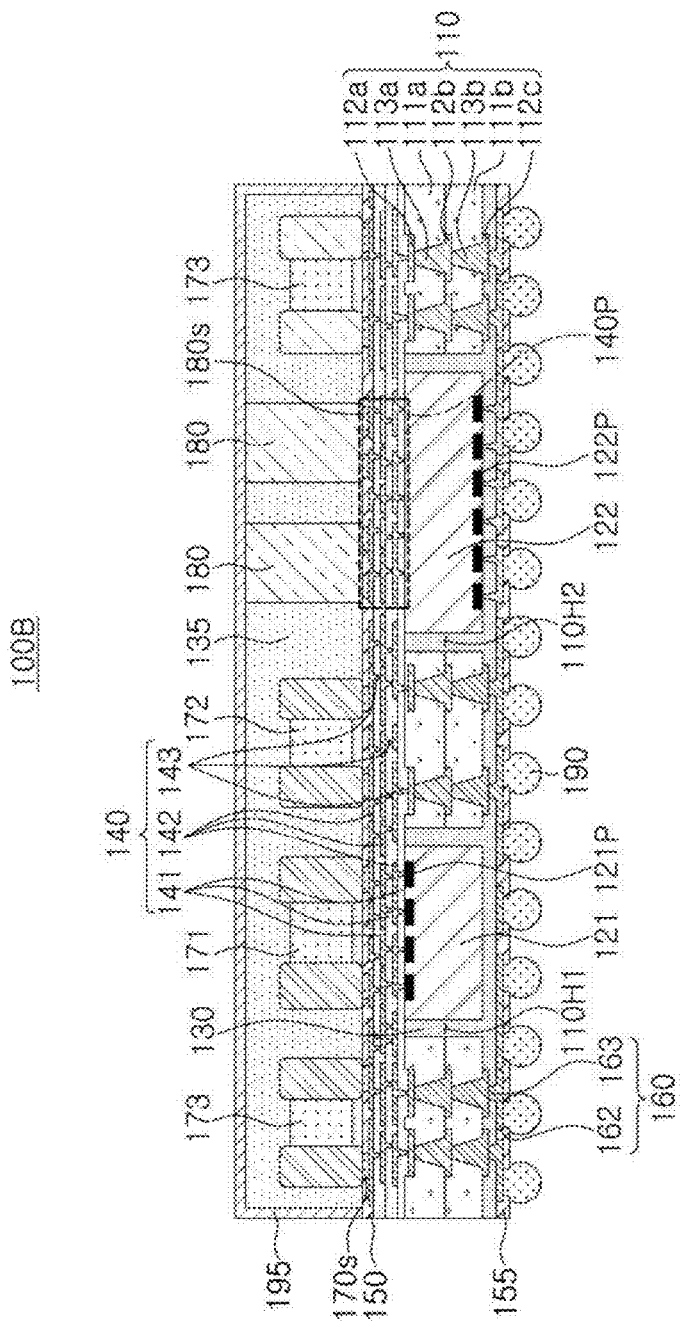
FIG. 12 is a cross-sectional view illustrating another example of a semiconductor package.

FIG. 12 is a cross-sectional view illustrating another example of a semiconductor package.

Referring to FIG. 12, in a semiconductor package 100B according to another example, a metal layer 195 may constitute atop surface and a portion of side surfaces of the semiconductor package 100B. The metal layer 195 may cover top and side surfaces of a second encapsulant 135, and may extend over only a first connection member 140 without extending downwardly. Even in this case, the metal layer 195 may be in contact with a heat dissipation structure 180 on a top surface of the second encapsulant 135 to further improve heat dissipation of the semiconductor package 100B.

The other components are substantially the same as those of the above-described semiconductor package 100A, and thus, detailed descriptions thereof will be omitted.

Figure 13:
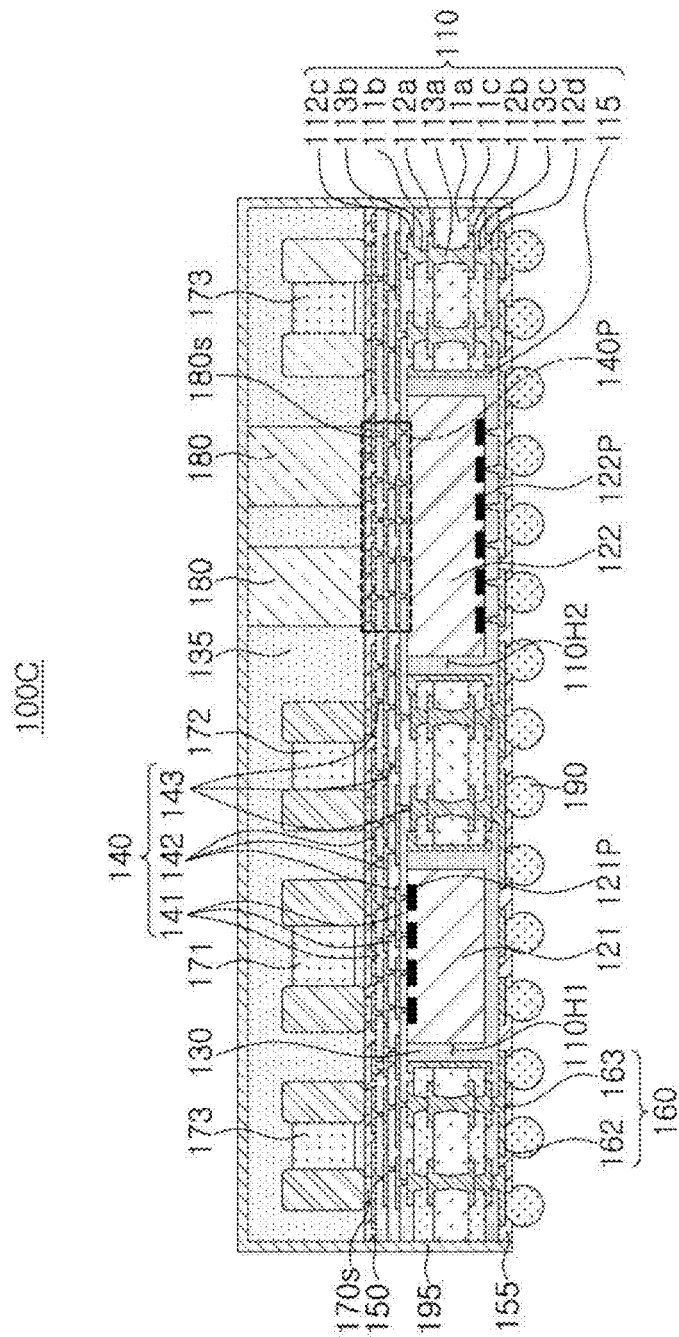
FIG. 13 is a cross-sectional view illustrating another example of a semiconductor package.

FIG. 13 is a cross-sectional view illustrating another example of a semiconductor package.

Referring to FIG. 13, in a semiconductor package 100C according to another example, a frame 110 has another shape. Specifically, the frame 110 includes a first frame insulating layer 111a, a first wiring layer 112a and a second wiring layer 112b respectively disposed on both surfaces of the first frame insulating layer 111a, a second frame insulating layer 111b and a third frame insulating layer 111c, disposed on both surfaces of the first frame insulating layer 111a, respectively covering the first wiring layer 112a and the second wiring layer 112b, a third wiring layer 112c disposed on a side of the second frame insulating layer 111b opposing a side in which the first wiring layer 112a is embedded, a third wiring layer 112d disposed on a side of the third frame insulating layer 111c opposing a side in which the second wiring layer 112b is embedded, a first wiring via 113a penetrating through the first frame insulating layer 111a and electrically connecting the first and second wiring layers 112a and 112b to each other, a second wiring via 113b penetrating through the second frame insulating layer 111b and electrically connecting the first and third wiring layers 112a and 113c to each other, and a third wiring via 113c penetrating through the third frame insulating layer 111c and electrically connecting the second and fourth wiring layers 112b and 112d. Since the frame 110 includes a greater number of wiring layers 112a, 112b, 112c, and 112d, a first connection member 140 may be further simplified.

The first frame insulating layer 111a may have a thickness greater than a thickness of each of the second and third frame insulating layers 111b and 111c. The first frame insulating layer 111a may have a relatively great thickness to maintain rigidity, and the second and third frame insulating layers 111b and 111c may be introduced to form a greater number of wiring layers 112c and 112d. Under a similar viewpoint, a wiring via of the wiring via 113a, penetrating through the first frame insulating layer 111a, may have greater height and/or average diameter of each of the second and third wiring layers 113b and 113c penetrating through the second and third frame insulating layers 111b and 111c. In addition, the wiring via of the first wiring via 113a may have an hourglass shape or a cylindrical shape, while wiring vias of the second and third wiring vias 113b and 113c may have tapered shapes in directions opposite to each other, respectively. Each of the first to fourth wiring layers 112a, 112b, 112c, and 112d may have a thickness greater than a thickness of each of the first redistribution layers 142.

As necessary, a frame metal layer 115 may be further disposed on wall surfaces of first and second through-portions 110H1 and 110H2 of the frame 110, and a frame metal layer 115 may be formed to cover the entire wall surface. The frame metal layer 115 may include a metal material such as copper (Cu). An electromagnetic shielding effect and a heat dissipation effect of the first and second semiconductor chips 121 and 122 may be improved through the frame metal layer 115.

The other components are substantially the same as those of the above-described semiconductor package 100A, and thus, detailed descriptions thereof will be omitted. A feature configuration of the above-described semiconductor package 100C may be applied to the semiconductor package 100B according to another example.

Figure 14:
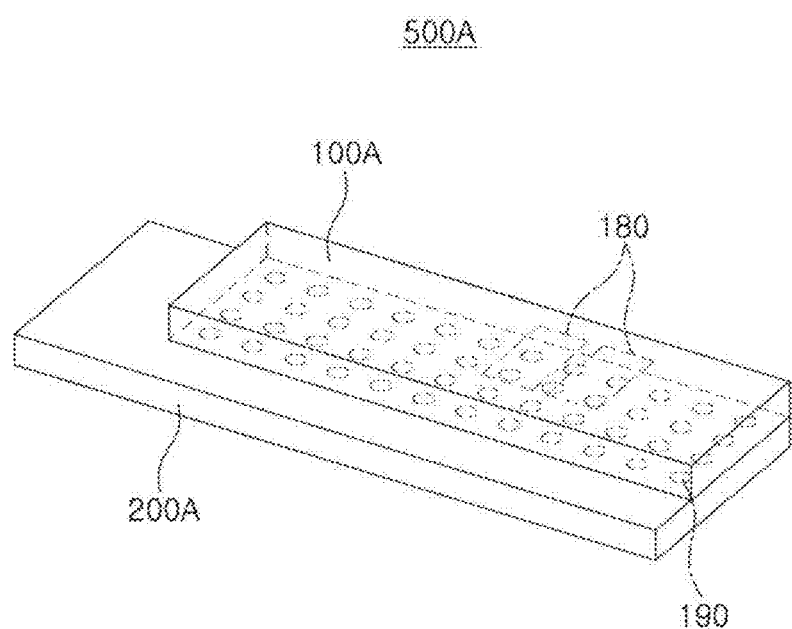
FIG. 14 is a schematic perspective view illustrating an example of an antenna module.

FIG. 14 is a schematic perspective view illustrating an example of an antenna module.

Referring to FIG. 14, an antenna module 500A according to an example includes an antenna substrate 200A and a semiconductor package 100A disposed on a top surface of the antenna substrate 200A to be electrically connected to the antenna substrate 200A. The antenna substrate 200A includes an antenna pattern and a ground pattern as a region in which an mmWave/5G Antenna may be implemented. The semiconductor package 100A includes a plurality of semiconductor chips and passive components, and may have the same structure as described above with reference to FIGS. 9, 12, and 13. The semiconductor package 100A may be mounted on the antenna substrate 200A through the electrical connection metal 190.

A frequency and a bandwidth for use in various components, mounted in a mobile device such as a smartphone, are increasing with the recent trend toward high performance of electronic devices. In detail, an antenna module for mm-wave and 5G communications requires a structure in which signal transmission between mounting components such as semiconductor chips, using a radio frequency, is efficient. When an antenna module is implemented in a module manner of a system in package type (SIP) according to a related art, various semiconductor chips and passive components are directly mounted on a bottom surface of an antenna substrate by surface mount technology (SMT), respectively.

Meanwhile, the antenna module 500A according to an example includes a semiconductor package 100A, in which the first and second semiconductor chips 121 and 122 and the passive components 171, 172, and 173 are packaged into a single package, mounted on the antenna substrate 200A, and may be disposed such that an active surface of a second semiconductor chip 122 faces the underlying antenna substrate 200A. As a result, an RF signal path may be relatively shortened between the second semiconductor chip 122 and the antenna substrate 200A and may be optimized. Since the semiconductor package 100A includes a heat dissipation structure 180 disposed above the second semiconductor chip 122, heat dissipation characteristics may be improved and electrical shielding may be enhanced by the metal layer 195 disposed on an external side of the semiconductor package 100A.

The antenna module 500A may be electrically connected to an external device, in which the antenna module 500A is mounted, through a connector connected to one side of the antenna substrate 200A.

As described above, a semiconductor package having improved heat dissipation characteristics while significantly reducing heat transmission loss, and an antenna module, including the semiconductor package, may be provided.

While example embodiments have been shown and described above, it will be apparent to those skilled in the art that modifications and variations could be made without departing from the scope of the present disclosure as defined by the appended claims.

What is claimed is:

1. A semiconductor package comprising:
a frame having first and second through-portions;
a first semiconductor chip disposed in the first through-portion, and having a first surface, on which a first connection pad is disposed, and a second surface opposing the first surface;
a second semiconductor chip disposed in the second through-portion, and having a third surface, on which a second connection pad is disposed, and a fourth surface opposing the third surface;
a first encapsulant covering at least a portion of the first and second semiconductor chips;
a first connection member, disposed on the first and second semiconductor chips, the first connection member including a first redistribution layer connected to the first and second connection pads, and the first connection member including a heat dissipation pattern layer;
a passive component disposed above the first semiconductor chip on the first connection member and connected to the first redistribution layer; and
a heat dissipation structure disposed above the second semiconductor chip on the first connection member and connected to the heat dissipation pattern layer,
wherein the heat dissipation structure is disposed outside the first and second through-portions.

2. The semiconductor package of claim 1, wherein the first surface of the first semiconductor chip faces the first connection member, and
the fourth surface of the second semiconductor chip faces the first connection member.

3. The semiconductor package of claim 1, wherein the heat dissipation pattern layer is connected to the fourth surface of the second semiconductor chip and provides a heat transfer path between the second semiconductor chip and the heat dissipation structure.

4. The semiconductor package of claim 1, further comprising:
a second encapsulant covering at least a portion of the passive component and the heat dissipation structure,
wherein the heat dissipation structure is exposed from the second encapsulant.

5. The semiconductor package of claim 4, further comprising:
a metal layer covering a top surface and a side surface of the second encapsulant.

6. The semiconductor package of claim 5, wherein the heat dissipation structure has a top surface in contact with the metal layer.

7. The semiconductor package of claim 5, wherein the metal layer extends from the side surface of the second encapsulant to a lower portion of the second encapsulant to cover at least a side surface of the first connection member.

8. The semiconductor package of claim 7, wherein the metal layer further extends from the side surface of the first connection member to cover a side surface of the frame.

9. The semiconductor package of claim 4, wherein the second encapsulant includes a material different from a material of the first encapsulant.

10. The semiconductor package of claim 1, further comprising:

a second connection member disposed on a bottom surface of the first encapsulant and including a second redistribution layer connected to the first and second connection pads.

11. The semiconductor package of claim 10, wherein the frame includes a wiring structure connecting the first and second redistribution layers to each other.

12. The semiconductor package of claim 10, wherein the first and second connection members include first and second vias connected to the first and second redistribution layers, respectively, and the first connection pad of the first semiconductor chip is connected to the first via, and the second connection pad of the second semiconductor chip is connected to the second via.

13. The semiconductor package of claim 12, wherein the second via has a diameter greater than a diameter of the first via.

14. The semiconductor package of claim 12, wherein the first and second vias include first and second seed layers, respectively, and the first and second seed layers include materials different from each other.

15. The semiconductor package of claim 12, wherein the first via penetrates through an insulating layer of the first connection member, and the second via penetrates through the first encapsulant, and the insulating layer includes a photosensitive material, and the first encapsulant includes a non-photosensitive material.

16. The semiconductor package of claim 12, wherein the first and second vias are tapered in opposite directions.

17. The semiconductor package of claim 1, wherein each of the heat dissipation structure and the passive component is surface-mounted on the first connection member by a bump.

18. An antenna module comprising:

an antenna substrate including an antenna pattern; and the semiconductor package of claim 1 disposed on one surface of the antenna substrate to be connected to the antenna substrate.

19. The antenna module of claim 18, wherein the first surface of the first semiconductor chip faces the first connection member, and the third surface of the second semiconductor chip faces the antenna substrate.

20. The semiconductor package of claim 1, wherein the first semiconductor chip includes a power management integrated circuit (PMIC) chip, and the second semiconductor chip includes a radio-frequency integrated circuit (RFIC) chip.

* * * * *